(12) United States Patent
Mochida et al.

(10) Patent No.: US 7,759,684 B2
(45) Date of Patent: Jul. 20, 2010

(54) NITRIDE SEMICONDUCTOR LIGHT EMITTING DEVICE AND METHOD FOR FABRICATING THE SAME

(75) Inventors: Atsunori Mochida, Osaka (JP); Yoshiaki Hasegawa, Okayama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/401,929

(22) Filed: Mar. 11, 2009

(65) Prior Publication Data
US 2009/0236630 A1    Sep. 24, 2009

(30) Foreign Application Priority Data
Mar. 21, 2008    (JP)    ............................. 2008-073911

(51) Int. Cl.
*H01L 27/15* (2006.01)
(52) U.S. Cl. .................. 257/79; 257/103; 257/627; 257/628
(58) Field of Classification Search .................. 257/79, 257/103, 627, 628
See application file for complete search history.

(56) References Cited

U.S. PATENT DOCUMENTS 7,285,799 B2 * 10/2007 Kim et al. ...................... 257/79
7,668,218 B2 * 2/2010 Michiue et al. ......... 372/44.011
2005/0249255 A1 11/2005 Dwilinski et al.
2007/0014323 A1 * 1/2007 Tachibana et al. ........ 372/46.01
2007/0080368 A1 4/2007 Kamikawa et al.
2007/0205424 A1 9/2007 Kamikawa et al.

FOREIGN PATENT DOCUMENTS

JP    2007-103814    4/2007
JP    2007-273951    10/2007

* cited by examiner

*Primary Examiner*—Long Pham
(74) *Attorney, Agent, or Firm*—McDermott Will & Emery LLP

(57) ABSTRACT

A nitride semiconductor light emitting device includes a nitride semiconductor multilayer film. The nitride semiconductor multilayer film is formed on a substrate and made of nitride semiconductor crystals, and includes a light emitting layer. In the nitride semiconductor multilayer film, facets of a cavity are formed, and a protective film made of aluminum nitride crystals is formed on at least one of the facets. The protective film has a crystal plane whose crystal axes form an angle of 90 degrees with crystal axes of a crystal plane of the nitride semiconductor crystals constituting the facet of the cavity having the protective film formed thereon.

9 Claims, 4 Drawing Sheets

Depth from the surface of protective film[μm]

NITRIDE SEMICONDUCTOR LIGHT EMITTING DEVICE AND METHOD FOR FABRICATING THE SAME

CROSS REFERENCE TO RELATED APPLICATION

This application claims priority from Japanese Patent Application No. 2008-73911 filed on Mar. 21, 2008, which is hereby incorporated by reference in its entirety for all purposes.

BACKGROUND OF THE INVENTION

The present invention relates to a nitride semiconductor light emitting device and a method for fabricating the nitride semiconductor light emitting device.

In recent years, various kinds of semiconductor laser devices have been widely used as light sources for optical disk devices. Among others, blue-violet semiconductor laser devices which use III-V nitride semiconductors such as gallium nitride (GaN) are used as light sources for next-generation high-density optical discs (Blu-ray Discs), and are capable of oscillation of light in the short wavelength region (400 nm band) that can be focused to a smaller spot on an optical disc than light in the red and infrared regions. Thus, blue-violet semiconductor laser devices effectively increase reproduction and recording density of optical discs, and are becoming popular and indispensable.

New discs that use blue-violet semiconductor laser devices need highly reliable high-power blue-violet semiconductor laser devices so as to enable higher density and high-speed writing. In AlGaAs- and AlGaInP-based semiconductor laser devices used for conventional CDs (Compact Discs) and DVDs (Digital Versatile Disks), dielectric films (protective films) made of $SiO_2$, $Al_2O_3$, etc. are formed on the facets of the cavity to prevent deterioration of and optical damage to the facets of the cavity.

However, in GaN-based laser devices, if protective films made of oxide are formed on the facets of the cavity, the oxygen in the protective films causes the cavity facets to undergo oxidation and/or deterioration.

In light of this, Japanese Laid-Open Publication No. 2007-103814 (which will be hereinafter referred to as "Patent Document 1") has disclosed that layers made of aluminum nitride, when used as protective films formed on the facets of a GaN-based laser device, allow separation of oxygen from the cavity facets, thereby reducing oxidation-caused deterioration of the facets.

Japanese Laid-Open Publication No. 2007-273951 (which will be hereinafter referred to as "Patent Document 2") has also disclosed that when films made of aluminum nitride crystals or aluminum oxynitride crystals are used as protective films formed on the facets of a GaN-based laser device, the crystallinity of the protective films is improved as compared to amorphous protective films, thereby suppressing permeation of oxygen into the protective films.

SUMMARY OF THE INVENTION

In order to stably operate a GaN-based laser device at a high power level, stable protective films that reduce light absorption on the cavity facets caused by non-radiative recombination and that are capable of resisting high optical output need to be formed on the facets of the cavity.

As a result of a thorough study, we found that stable high-power operation of a GaN-based laser device is greatly affected by agglomeration (a pileup) of silicon (Si) formed in the interfaces between the facets of the cavity and the protective films, and thus reduction in the amount of such Si was very important to increase the reliability of the GaN-based laser device. We also found that such a Si pileup was not significant in conventional GaAs-based infrared laser devices and GaAs-based red laser devices, but occurred noticeably in GaN-based laser devices. Although the detailed mechanism of this is unknown, we presume that there is a possibility that such a noticeable increase in the Si pileup occurs because missing nitrogen (N) atoms cause formation of vacancy-like point defects in the facets of the cavity in GaN-based laser devices, and Si is likely to bind to those point defects.

The conventional nitride semiconductor light emitting devices, however, have the following disadvantages.

In the conventional protective films made of aluminum nitride (AlN) described in Patent Document 1, the aluminum nitride typically has various orientations within the protective films. Thus, depending on the aluminum nitride orientation directions, the protective films have certain parts through which oxygen easily permeates, and deterioration of and optical damage to the cavity facets are likely to be caused.

It is also important to clean the interfaces between the cavity facets and the AlN films (the protective films). This is because foreign substances, such as Si, may adhere to the interfaces between the facets and the protective films and bind to oxygen to form $SiO_x$ which absorbs light. Consequently, the facets may deteriorate during reliability evaluation of the nitride semiconductor light emitting device.

In the conventional protective films made of aluminum nitride (AlN) crystals or aluminum oxynitride (AlON) crystals described in Patent Document 2, the crystal axes in the AlN or AlON layer on the light emitting part of the nitride semiconductor crystals are in the same direction as the crystal axes in that light emitting part. Since the crystal plane of the nitride semiconductor crystals in the light emitting facet of the cavity is an M-plane (101-0), the crystal plane of the protective film is also an M-plane. In M-planes, the bond length between atoms constituting the crystals is long, resulting in a coarse crystalline structure. Thus elements easily permeate through the M-plane, and so does oxygen, thereby often causing deterioration of and optical damage to the facets of the cavity.

Furthermore, in Patent Document 2, as set forth in Patent Document 1, the presence of Si and other impurities in the interfaces between the facets of the cavity and the protective films may cause the facets to deteriorate during reliability evaluation of the nitride semiconductor light emitting device.

The present invention provides a nitride semiconductor light emitting device that has ensured long-term reliability under high power operation and that can be fabricated with a high yield, and a method for fabricating the nitride semiconductor light emitting device.

Specifically, a first inventive nitride semiconductor light emitting device in includes a nitride semiconductor multilayer film formed on a substrate, made of nitride semiconductor crystals and including a light emitting layer. The nitride semiconductor multilayer film includes facets of a cavity, and a protective film made of aluminum nitride crystals is formed on at least one of the facets of the cavity. The protective film has a crystal plane whose crystal axes form an angle of 90 degrees with crystal axes of a crystal plane of the nitride semiconductor crystals constituting the facet of the cavity having the protective film formed thereon.

In the device thus structured, the protective film has a dense structure, thereby suppressing oxygen from permeating through the protective film during reliability testing of the nitride semiconductor light emitting device, and thus reducing deterioration of the cavity facet.

A second inventive nitride semiconductor light emitting device includes a nitride semiconductor multilayer film formed on a substrate, made of nitride semiconductor crystals and including a light emitting layer. The nitride semiconductor multilayer film has facets of a cavity, and a protective film made of nitride crystals or oxynitride crystals is formed on at least one of the facets of the cavity. A second protective film made of aluminum nitride crystals is formed on the protective film. The second protective film has a crystal plane whose crystal axes form an angle of 90 degrees with crystal axes of a crystal plane of the nitride semiconductor crystals constituting the facet of the cavity having the second protective film formed thereover.

In the device thus structured, the upper one (the second protective film) of the protective films formed on the cavity facet has a dense structure, and thus functions as a film for suppressing permeation of oxygen. It is therefore possible to suppress oxygen from permeating through the second protective film to reach the cavity facet, thereby preventing deterioration of the facet during reliability evaluation of the nitride semiconductor light emitting device.

In the preferred embodiments described later, the protective film in the second inventive nitride semiconductor light emitting device is made of aluminum nitride crystals.

In the first inventive nitride semiconductor light emitting device, the protective film preferably further has a crystal plane whose crystal axes are in parallel with the crystal axes of the crystal plane of the nitride semiconductor crystals constituting the facet of the cavity having the protective film formed thereon.

Then, it is possible to deposit the protective film under a wider range of conditions. Hence, not only oxygen is less likely to permeate through the protective film having a dense structure, but also the protective film is formed in a stable manner.

In the first and second inventive nitride semiconductor light emitting devices, the amount of silicon at an interface between the protective film and the facet of the cavity having the protective film formed thereon is preferably $1 \times 10^{20}$ atoms/cm$^3$ or less.

In the device thus structured, the amount of silicon at the interface between the cavity facet and the protective film is reduced, thereby suppressing formation of SiO$_x$ which absorbs light. Accordingly, deterioration of the facet during reliability evaluation of the nitride semiconductor light emitting device is prevented.

In the case in which the amount of silicon at the interface between the cavity facet and the protective film is $1 \times 10^{20}$ atoms/cm$^3$ or less, when the amount of silicon per unit area at the interface is calculated by secondary ion mass spectrometry, the amount of silicon at the interface is preferably $2 \times 10^{14}$ atoms/cm$^2$ or less.

Then, as set forth above, it is possible to reduce the amount of silicon at the interface between the cavity facet and the protective film, thereby suppressing formation of SiO$_x$, which absorbs light, at the interface. Accordingly, deterioration of the facet during reliability evaluation of the nitride semiconductor light emitting device is prevented.

In the first and second inventive nitride semiconductor light emitting devices, a protective film containing oxide or oxynitride is preferably formed on the protective film.

In the device thus structured, deterioration of the interface between the cavity facet and the protective film during reliability evaluation of the nitride semiconductor light emitting device is suppressed. In addition, since the design freedom of the protective films is increased, the reflectance of the protective films can be adjusted at will, thereby enabling the desired device characteristics to be achieved.

Likewise, the second inventive nitride semiconductor light emitting device preferably further includes, on the second protective film, a protective film containing oxide or oxynitride.

In the device thus structured, deterioration of the interface between the cavity facet and the protective film during reliability evaluation of the nitride semiconductor light emitting device is suppressed. In addition, since the design freedom of the protective films is increased, the reflectance of the protective films can be adjusted at will, thereby enabling the desired device characteristics to be achieved.

In the first and second inventive nitride semiconductor light emitting devices, the protective film containing oxide or oxynitride preferably contains at least one element selected from the group consisting of Al, Si, Zr, Ti, Ta, Ga, Nb, and Hf.

In the device thus structured, the dielectric material used for the second protective film can be selected at will. As a result, the reflectance of the cavity facet can be adjusted at will, thereby enabling the desired device characteristics to be achieved.

An inventive nitride semiconductor light emitting device fabrication method is a method for fabricating a nitride semiconductor light emitting device in which a protective film is formed on at least one of facets of a cavity formed in a nitride semiconductor multilayer film made of nitride semiconductor crystals, the protective film being made of aluminum nitride crystals and having a crystal plane whose crystal axes form an angle of 90 degrees with crystal axes of a crystal plane of the nitride semiconductor crystals constituting the at least one facet. The protective film is formed on the at least one facet of the cavity in a plasma atmosphere in which a gas containing nitrogen is contained, the nitrogen-containing gas having a partial pressure of 20% or higher.

DETAILED DESCRIPTION OF THE INVENTION

Hereinafter, the preferred embodiments of the present invention will be described in detail with reference to the accompanying drawings. It should be noted that the present invention is not limited to the following embodiments.

First Embodiment

A first embodiment of the present invention will be described below with reference to the accompanying drawings.

Figure 1:
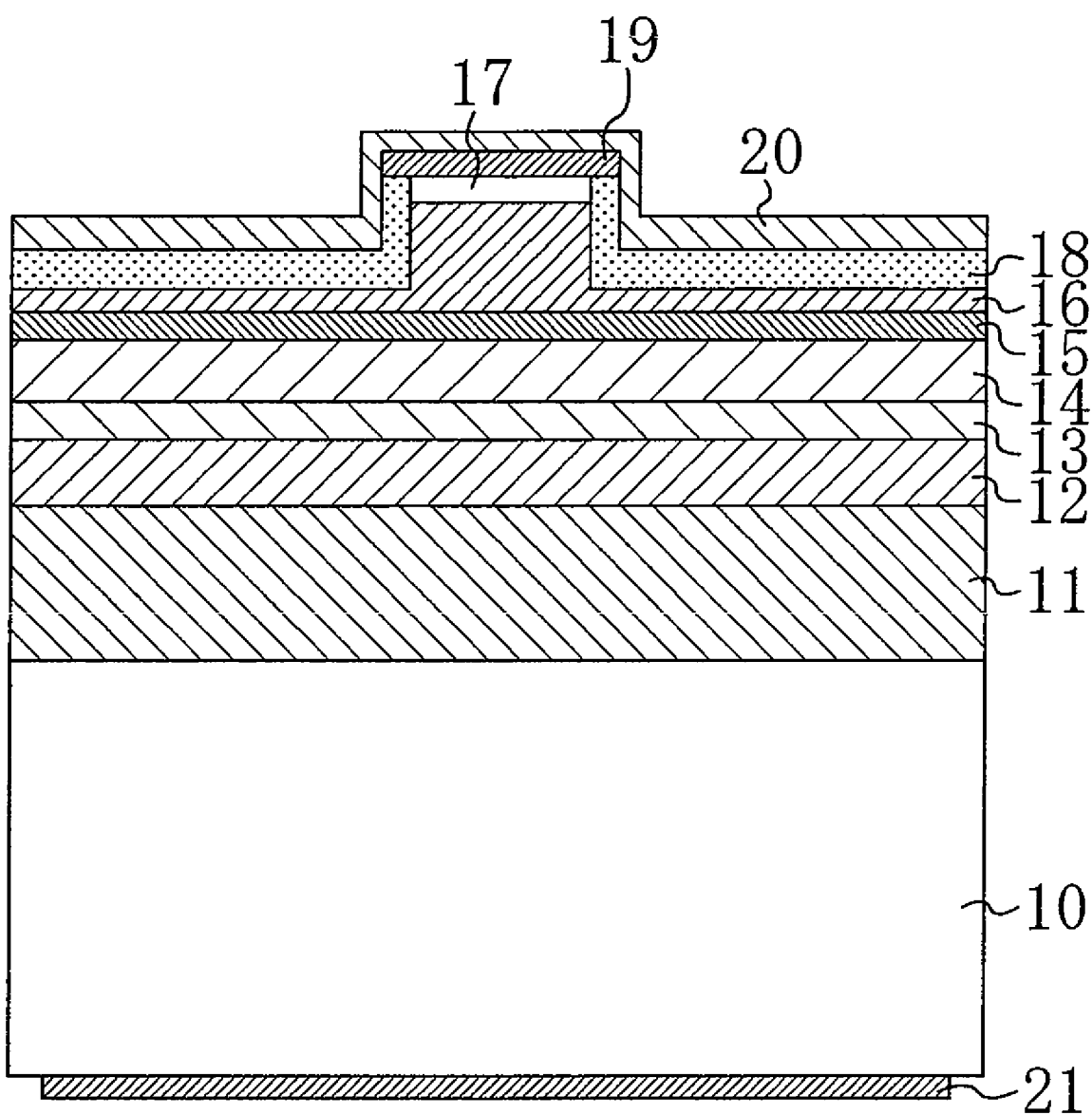
FIG. 1 is a cross-sectional view of a nitride semiconductor light emitting device according to first to third embodiments of the invention, taken in a direction perpendicular to the longitudinal direction of a cavity.

FIG. 1 is a cross-sectional view of a nitride semiconductor light emitting device according to the first embodiment of the present invention (a cross-sectional view taken in a direction perpendicular to the longitudinal direction of a cavity).

The nitride semiconductor light emitting device of this embodiment is formed on a surface of an n-type GaN substrate 10 which has a thickness of about 80 μm and which is doped with an n-type dopant (Si) at a concentration of approximately $1 \times 10^{18}$ atoms/cm$^3$. On the surface of the n-type GaN substrate 10, an n-type AlGaN clad layer 11 (having a thickness of 1.5 μm and doped with Si at a concentration of $5 \times 10^{17}$ atoms/cm$^3$), an n-type GaN light guide layer 12 (having a thickness of 160 nm and doped with Si at a concentration of $5 \times 10^{17}$ atoms/cm$^3$), an InGaN multi-quantum well active layer 13 (in which each well layer has a thickness of 7 nm, and each barrier layer has a thickness of 13 nm), an InGaN light guide layer 14 (having a thickness of 60 nm), a p-type AlGaN light guide layer 15 (doped with Mg at a concentration of $1 \times 10^{19}$ atoms/cm$^3$), a p-type AlGaN clad layer 16 (having a thickness of 0.5 μm and doped with Mg at a concentration of $1 \times 10^{19}$ atoms/cm$^3$), and a p-type GaN contact layer 17 (having a thickness of 0.1 μm and doped with Mg at a concentration of $1 \times 10^{20}$ atoms/cm$^3$) are formed in that order. It should be noted that the numerical values and dopant materials within the parentheses are cited merely by way of example and do not limit the present invention.

Of the above-described layers, part of the p-type AlGaN clad layer 16 and the p-type GaN contact layer 17 are processed into a ridge-stripe shape extending in the longitudinal direction of the cavity. The ridge stripe has a width of about 1.4 μm, for example, the cavity length is 800 μm, for example, and the chip width is 200 μm, for example.

On the upper surface of the ridge stripe portion, a p-side Pd/Pt contact electrode 19 is formed so as to be in contact with the p-type GaN contact layer 17. In the region other than the ridge stripe portion, a dielectric film 18 is formed on the upper surface of the exposed part of the p-type AlGaN clad layer 16, and a p-side Ti/Pt/Au wire electrode 20 is formed on the p-side Pd/Pt contact electrode 19 and on the dielectric film 18.

Moreover, an n-side Ti/Pt/Au contact electrode 21 is formed on the back side of the n-type GaN substrate 10.

A method for fabricating the nitride semiconductor light emitting device discussed in this embodiment will be described below.

Crystals of the nitride semiconductor multilayer film (the n-type AlGaN clad layer 11, the n-type GaN light guide layer 12, the InGaN multi-quantum well active layer 13, the InGaN light guide layer 14, the p-type AlGaN light guide layer 15, the p-type AlGaN clad layer 16, and the p-type GaN contact layer 17) are grown on the surface of the n-type GaN substrate 10 by a MOCVD (Metal Organic Chemical Vapor Deposition) process.

Next, a dielectric film made of SiO$_2$ etc., which is used as a mask for forming the ridge stripe structure, is formed on the upper surface of the nitride semiconductor multilayer film by a plasma CVD (Chemical Vapor Deposition) process, for example. The dielectric film is partially removed by photolithography using hydrofluoric acid (HF) etc. so that the part of the multilayer film other than the ridge-stripe-portion formation region is exposed. With the remaining part of the dielectric film left on the ridge-stripe-portion formation region being used as a mask, the p-type AlGaN clad layer 16 is etched partway by ISM (Inductively Super Magnetron) dry etching equipment, for example, thereby forming the ridge stripe portion.

Thereafter, the dielectric film used as the mask is removed, and a dielectric film made of SiO$_2$, for example, is formed over the entire upper surface of the p-type AlGaN clad layer 16. The dielectric film is then partially removed by photolithography using hydrofluoric acid (HF) etc. in such a manner that only the ridge stripe portion is exposed. Through this process step, the dielectric film 18 as a current stopping layer is formed. Subsequently, Pd/Pt constituting the p-side Pd/Pt contact electrode 19 is formed over the upper surface of the p-type GaN contact layer 17 by metal vapor deposition, and the part of the metal (Pd/Pt) other than the ridge stripe portion is then removed by a liftoff process to form the p-side Pd/Pt contact electrode 19. A metal is evaporated on the upper surfaces of the dielectric film 18 and p-side Pd/Pt contact electrode 19, thereby forming the p-side Ti/Pt/Au wire electrode 20.

Subsequently, the back side of the n-type GaN substrate 10 is polished until the n-type GaN substrate 10 is cut to a thickness of about 80 μm. Thereafter, a metal is evaporated on the back side of the n-type GaN substrate 10, thereby forming the n-side Ti/Pt/Au contact electrode 21. Through the foregoing process steps, the nitride semiconductor light emitting device having the structure shown in FIG. 1 is fabricated.

Next, primary cleavage is performed along the (101-0) plane of the n-type GaN substrate 10 using equipment such as scribing equipment and braking equipment, thereby forming a cavity having a cavity length of 800 μm in this embodiment. In this primary cleavage process step, the nitride semiconductor light emitting device is fixed on an adhesive sheet, and a protective sheet is placed on the upper surface of the nitride semiconductor light emitting device to protect the nitride semiconductor light emitting device, and then the nitride semiconductor light emitting device is subject to the primary cleavage. When the nitride semiconductor light emitting device is cleaved in this manner, the facets of the cavity thereof may be exposed to an atmosphere in which the facets are sandwiched between the adhesive sheet and the protective sheet during the primary cleavage, and may be in contact with the adhesive sheet and/or the protective sheet after the cleavage. As a result, components contained in the adhesive sheet and/or in the protective sheet may possibly adhere to the cavity facets. The components contained in the adhesive sheet and in the protective film may include siloxane-based material, in which Si is contained. Thus, during and/or after the primary cleavage, Si existing in the adhesive sheet and/or in the protective sheet may adhere to the cavity facets, which may result in a significant effect on the long-term reliability of the nitride semiconductor light emitting device. In view of this, in this embodiment, sheets which contain no Si are employed as the adhesive and protective sheets in performing the primary cleavage of the nitride semiconductor light emitting devices.

Subsequently, the laser bar including the nitride semiconductor light emitting device after the primary cleavage is loaded in ECR (electron cyclotron resonance) equipment. After the equipment is evacuated, protective films made of dielectric films are formed on the facets of the cavity.

Figure 2:
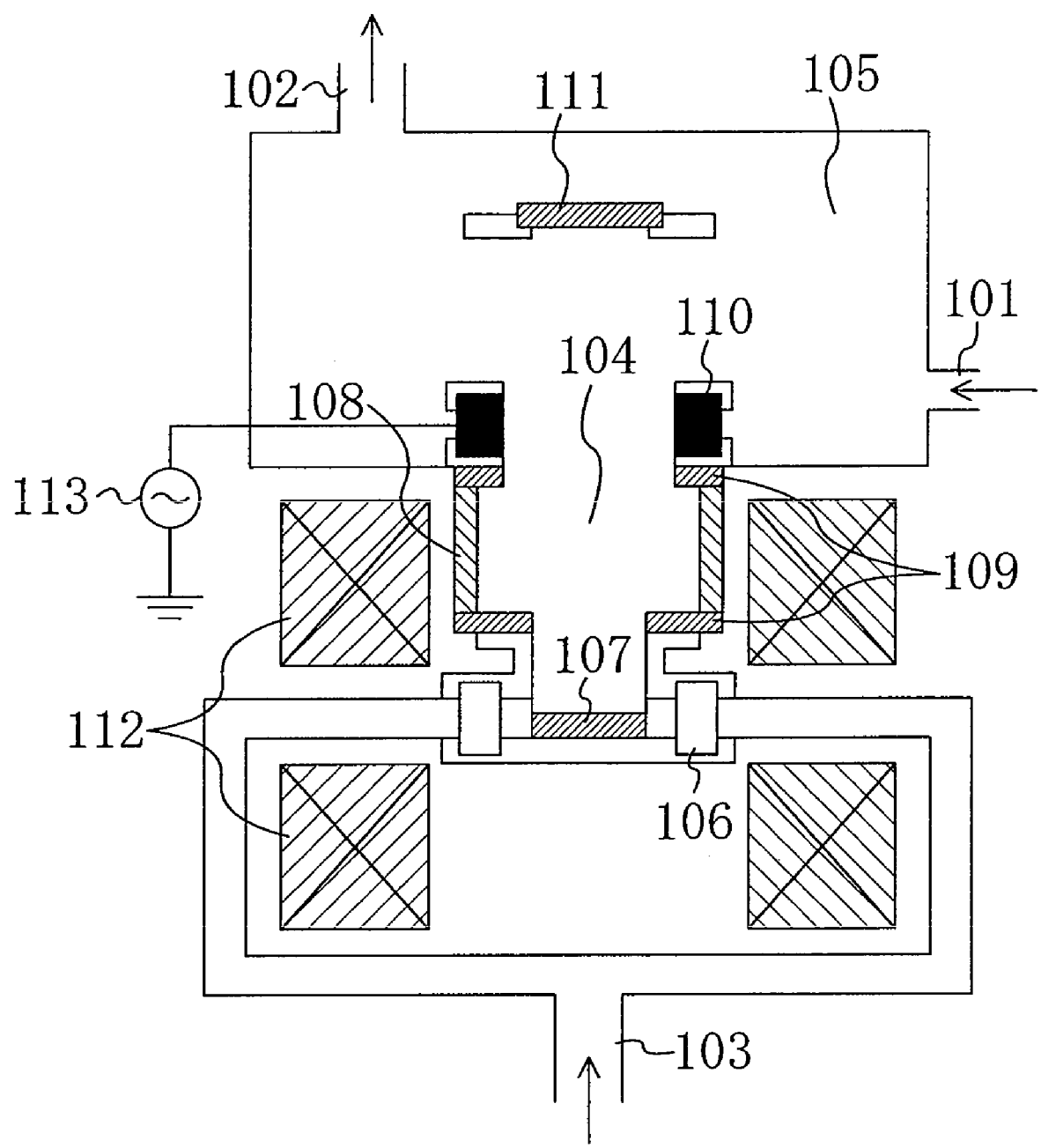
FIG. 2 is a cross-sectional view of ECR sputtering equipment.

FIG. 2 shows a cross-sectional structure of the ECR equipment. This equipment includes a plasma chamber 104, a film formation chamber 105, a target 110, and magnetic coils 112. In the plasma chamber 104, ECR plasma is generated. The magnetic coils 112 are provided around the plasma chamber 104 to form a magnetic field. The target 110 is connected with an RF power source 113, and the amount of sputtering is controlled by the RF power source 113. In this embodiment, high-purity Al is used as the target 110. A microwave is introduced from a microwave inlet 103, and then the microwave is introduced into the plasma chamber 104 through an inlet window 106. An ECR plasma is generated by the microwave and the magnetic field formed by the magnetic coils 112. The film formation chamber 105 is evacuated through an outlet 102, and a gas containing argon (Ar), a gas containing oxygen ($O_2$), and a gas containing nitrogen ($N_2$) are introduced through a gas inlet 101. The laser bar is placed on a specimen stage 111 in the film formation chamber 105 so that the facets of the cavity are irradiated with the ECR plasma. To protect the plasma chamber 104 from the ECR plasma, members made of quartz cover the inside of the plasma chamber 104; members, such as an end plate 107, an inner tube 108, and window plates 109 placed on and under the inner tubes 108, are formed of quartz.

It is preferable that a plasma cleaning process using a gas containing Ar be performed to clean the facets of the cavity before the formation of the protective films. In the ECR equipment, if plasma irradiation is only performed with no bias applied to the target 110, the target 110 will not be sputtered. Therefore, the cleaning process can be performed by generating a plasma in a non-biased condition. This cleaning process may be performed by using a mixture of a gas containing Ar and a gas containing $N_2$ instead of using an Ar-containing gas alone.

First, a method for forming a protective film on the light-emitting facet of the cavity will be described. Before the formation of the protective film, the cleaning process mentioned above (i.e., the plasma cleaning process using an Ar-containing gas) is performed. Thereafter, a gas containing Ar and a gas containing $N_2$ are introduced into the film formation chamber 105 to generate a plasma while a bias is applied to the target 110, thereby depositing an aluminum nitride (AlN) film on a facet 30 of the cavity as a protective film 31. In this embodiment, since aluminum nitride is formed as the protective film 31, the target 110 is Al, and the protective film 31 is deposited in the chamber in which the Al target is placed.

Figure 4:
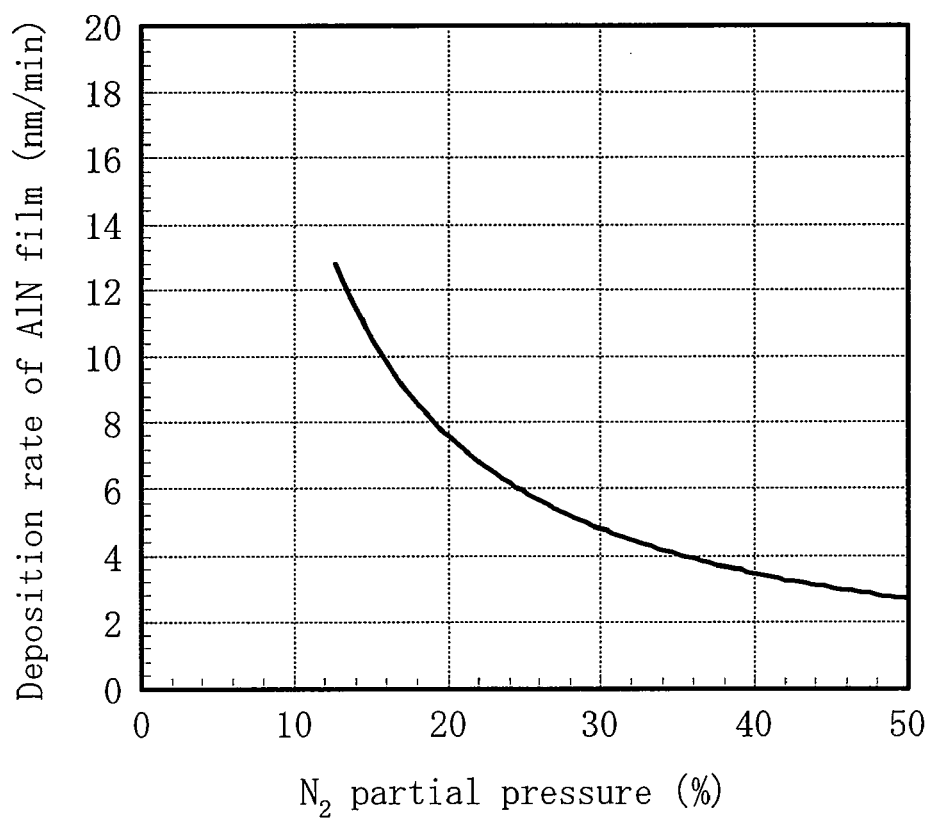
FIG. 4 is a graph showing correlation between N$_2$ partial pressure and deposition rate in the first to fourth embodiments of the invention.

In this process step, as shown in FIG. 4, a lower deposition rate is achieved by forming the protective film 31 with the $N_2$ partial pressure being high. Reductions in the deposition rate allow the protective film 31 to be formed without being influenced by the state of the crystal axes of the facet of the cavity. Hence, when the protective film 31 is formed, the growth mode in the directions of crystal axes along which aluminum nitride crystals can easily grow becomes dominant, making it possible to obtain the crystal film (the protective film 31) oriented in the direction of the C-axis (0001) that differs by 90 degrees from the crystal axes of the crystal plane of the nitride semiconductor crystals constituting the cavity facet. This enables the protective film 31 of higher density to be formed on the light-emitting facet of the cavity. As described above, since the protective film 31 is an aluminum nitride crystal film oriented in the C-axis direction, the bond length between atoms constituting the aluminum nitride crystals is decreased, allowing the protective film 31 to be dense. Accordingly, it is possible to suppress permeation of oxygen through the interface between the cavity facet and the protective film 31 during reliability testing of the nitride semiconductor light emitting device.

Furthermore, since the protective film 31 is formed in the condition in which the $N_2$ partial pressure is high, that is, the Ar partial pressure is low, it is also possible to suppress plasma damage caused by the Ar-containing gas in the plasma chamber 104, and hence reduce wear of the members made of quartz (the end plate 107, the inner tube 108, and the window plates 109) resulting from etching. The reason for this is as follows. Due to the relatively large mass of Ar, if the Ar partial pressure is high, those quartz members will be exposed to the plasma and thus will be etched. However, if the Ar partial pressure is low, such etching of the quartz members is suppressed (or the amount of such Ar-caused etching is reduced). As a result, adhesion of the major constituents, Si and O, of the quartz members to the cavity facet during the plasma cleaning is suppressed. This reduction in Si concentration on the cavity facet reduces absorption of laser light caused by the formation of $SiO_x$ on the facet, and hence suppresses generation of heat on the cavity facet and initiation of deterioration of the facet.

As can be seen from FIG. 4, it is desirable that the nitrogen partial pressure in the Ar/$N_2$ mixed gas be set to 20% or higher.

After the formation of the protective film 31 made of aluminum nitride crystals, an aluminum oxide ($Al_2O_3$) film is deposited on the protective film 31 as a protective film 32 (a protective film which contains oxide or oxynitride). The reflectance on the light emitting facet of the cavity can be controlled by adjusting the thicknesses of the protective films 31 and 32. In this embodiment, the laser light reflectance is 18%.

In this embodiment, the protective film 31 and the protective film 32 are sequentially formed on the light emitting facet of the cavity. Nevertheless, even if only the protective film 31 serves as the protective film formed on the light emitting facet, the above-described effects are attainable so long as the thickness thereof is set so that the reflectance is 18%. Likewise, it does not matter whether the protective film 32 is a niobium oxide ($Nb_2O_5$) film, a zirconium dioxide ($ZrO_2$) film, a silicon dioxide ($SiO_2$) film, etc. instead of an aluminum oxide film so long as the thickness thereof is set so that the reflectance is 18%. Alternatively, the protective film 32 may be a film made of an oxide or an oxynitride of Ti, Ta, Ga, or Hf.

Next, a method for forming a reflective film on the reflecting facet of the cavity will be described. As in the case of forming the protective film 31 on the light emitting facet, after a cleaning process for cleaning the reflecting facet of the cavity is performed, a gas containing Ar and a gas containing $O_2$ are introduced into the film formation chamber 105 to deposit, e.g., an $Al_2O_3$ film as a first film on the reflecting facet of the cavity. Subsequently, the gases introduced into the film formation chamber are changed to other gases, and a reflective film composed of a multilayer film of $SiO_2$ and $ZrO_2$ is formed. The respective thicknesses of the $Al_2O_3$, $SiO_2$, and $ZrO_2$ films are adjusted so that a laser light reflectance of 90% or higher is achieved.

Then, the laser bar is subjected to secondary cleavage, thereby obtaining a laser chip.

Next, a description will be made of a mounting process. The above-mentioned laser chip is mounted on a submount formed of, e.g., AlN or SiC and having solder thereon, and is then mounted on a stem. Subsequently, an Au wire for current supply is connected to the p-side Ti/Pt/Au wire electrode 20 and to a wire electrode of the submount that is connected with the n-side Ti/Pt/Au contact electrode 21. Lastly, to isolate the laser chip from the open air, a cap with a window from which laser light is drawn out is fusion-bonded to the laser chip.

We operated the nitride semiconductor light emitting device fabricated in this embodiment at room temperature; the threshold current was 30 mA, the slope efficiency was 1.5 W/A, the oscillation wavelength was 405 nm, and continuous oscillation was performed. We also conducted a reliability test on the nitride semiconductor light emitting device by making the nitride semiconductor light emitting device perform CW (Continuous Wave) oscillation under high-temperature high-output conditions (70° C. and 160 mW). The nitride semiconductor light emitting device was able to operate stably for 1000 hours or more.

Figure 5:
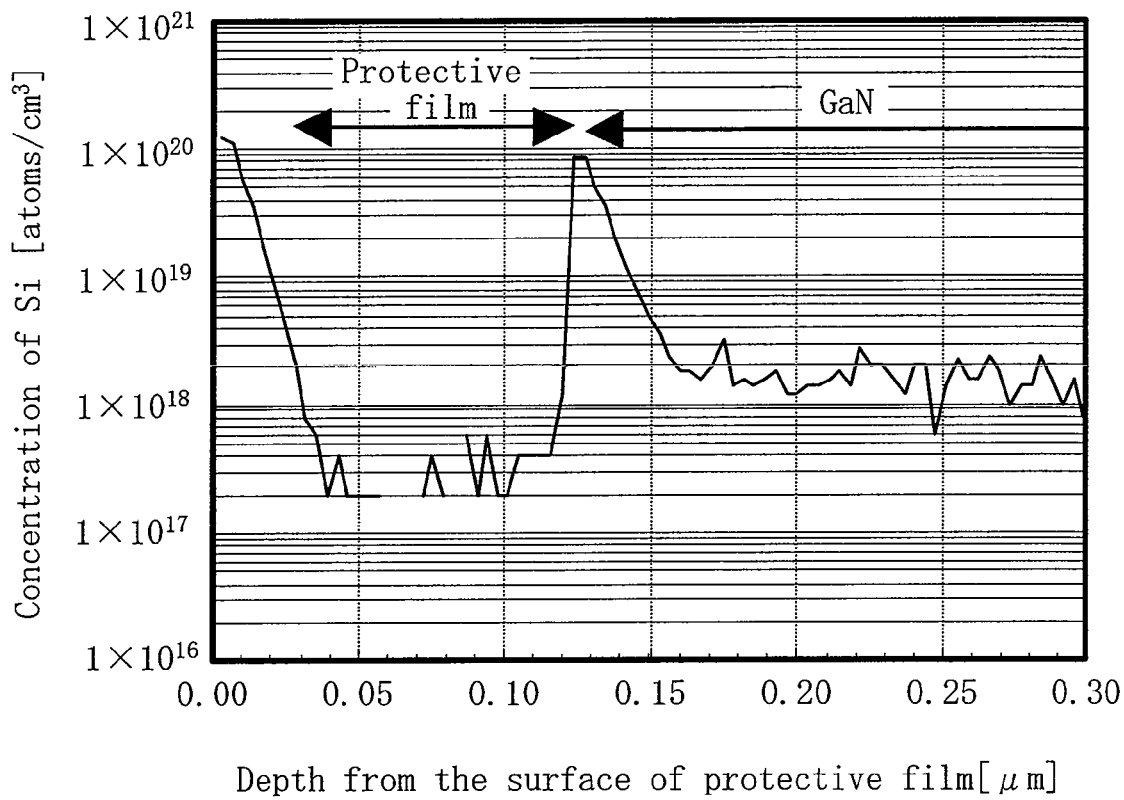
FIG. 5 is a graph showing results of analysis by SIMS in the first embodiment of the invention.

We then performed a SIMS (Secondary Ion Mass Spectrometry) analysis of the nitride semiconductor light emitting device fabricated in this embodiment. In performing the SIMS analysis, we removed the cap from the nitride semiconductor light emitting device and analyzed the light emitting facet of the cavity from the surfaces of the protective films 31 and 32. FIG. 5 shows the results of the analysis. As can be seen from the analysis results, a pileup of Si was observed at the interface between the facet of the cavity and the protective film 31. The Si pileup is largest at that interface, and the maximum value thereof was $8 \times 10^{19}$ atoms/cm$^3$. Considering the degree of light absorption by the Si-based material at the interface between the cavity facet and the protective film 31, the amount of Si per unit area is also important. Thus, we carried out a numerical analysis of the SIMS analysis results to obtain the amount of Si per unit area, which was approximately $1.2 \times 10^{14}$ atoms/cm$^2$ in this embodiment.

It is known that such a Si pileup becomes a laser light absorbing medium and thus greatly affects the COD (Catastrophic Optical Damage) level, in particular, a reduction in the COD level during reliability evaluation. It is therefore required that the amount of Si be $1 \times 10^{20}$ atoms/cm$^3$ at the most, and the amount of Si per unit area be $2 \times 10^{14}$ atoms/cm$^2$ or less.

As set forth above, on the light emitting facet of the cavity, a film made of aluminum nitride crystals and having a crystal plane whose crystal axes differ by 90 degrees from those of the crystal plane of the nitride semiconductor crystals constituting the cavity facet is formed as the protective film 31. Then, in the protective film 31, the bond length between atoms constituting the crystal structure is short, and the protective film 31 is thus dense. It is therefore possible to suppress oxygen from permeating through the interface between the cavity facet and the protective film 31 during reliability testing. It is also possible to lower the concentration of Si at the interface between the cavity facet and the protective film 31, thereby increasing the COD level and thus suppressing a reduction in the COD level during reliability evaluation. Hence it is clear that the protective film 31 thus formed greatly contributes to increasing the COD level, which is a critical issue in high power laser. Accordingly, the reliability and durability of the nitride semiconductor light emitting device increase dramatically.

Second Embodiment

Figure 3:
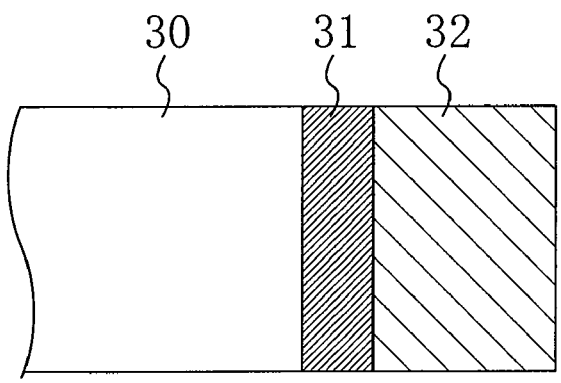
FIG. 3 is a cross-sectional view of the nitride semiconductor light emitting device according to the first, second and fourth embodiments of the invention, taken in a direction parallel to the longitudinal direction of the cavity.

A second embodiment of the present invention will be described below with reference to FIG. 3.

This embodiment differs from the first embodiment only in the method for forming the protective film on the light emitting facet of the cavity after the primary cleavage. This embodiment will be described mainly in terms of its differences from the first embodiment.

A method for forming a protective film on the light-emitting facet of the cavity will be described. Before the formation of the protective film, a cleaning process is performed on the light emitting facet of the cavity. Thereafter, a gas containing Ar and a gas containing $N_2$ are introduced into the film formation chamber 105 to generate a plasma while a bias is applied to the target 110, thereby depositing an aluminum nitride (AlN) film on the facet 30 of the cavity as a protective film 31. In this embodiment, since aluminum nitride is formed as the protective film 31, the target 110 is Al, and the protective film 31 is formed in the chamber in which the Al target is placed.

In this process step, as shown in FIG. 4, a lower deposition rate is achieved by forming the protective film 31 with the $N_2$ partial pressure being high. Reductions in the deposition rate allow the protective film 31 to be formed without being influenced by the state of the crystal axes of the cavity facet. Consequently, when the protective film 31 is formed, the growth mode in the directions of crystal axes along which aluminum nitride crystals can easily grow becomes dominant, making it possible to obtain the crystal film (the protective film 31) oriented in the direction of the C-axis (0001) that differs by 90 degrees from the crystal axes of the crystal plane of the nitride semiconductor crystals constituting the cavity facet. Hence, the protective film 31 in which the bond length between atoms constituting the crystals is short and which has higher density is formed on the light emitting facet of the cavity. In this way, it is possible to suppress permeation of oxygen through the interface between the cavity facet and the protective film 31 during reliability testing by forming a dense aluminum nitride crystal film oriented in the C-axis as the protective film on the light emitting facet.

Moreover, since the protective film 31 is formed in the condition in which the $N_2$ partial pressure is high, that is, the Ar partial pressure is low, it is also possible to suppress plasma damage caused by the Ar-containing gas in the plasma chamber 104, and hence reduce wear of the members made of quartz (the end plate 107, the inner tube 108, and the window plates 109) resulting from etching. The reason for this is as follows. Due to the relatively large mass of Ar, if the Ar partial pressure is high, those quartz members will be exposed to the plasma and this will be etched. However, if the Ar partial pressure is low, such etching of those quartz members is suppressed (or the amount of such Ar- caused etching is reduced). Consequently, adhesion of the major constituents, Si and O, of the quartz members to the cavity facet during the plasma cleaning is suppressed. This reduction in Si concentration on the cavity facet reduces absorption of laser light caused by the formation of $SiO_x$ on the facet, and hence suppresses generation of heat on the cavity facet and initiation of deterioration of the facet. Furthermore, since the Si concentration on the cavity facet is lowered, the cleanliness on the cavity facet is increased, that is, adhesion of impurities to the cavity facet is suppressed, thereby making it easier to form the oriented crystal film on the cavity facet. As a result, permeation of oxygen through the interface between the cavity facet and the protective film 31 is suppressed.

As can be seen from FIG. 4, it is desirable that the nitrogen partial pressure in the $Ar/N_2$ mixed gas be set to 20% or higher.

After the formation of the protective film 31 made of aluminum nitride, an aluminum oxynitride (AlON) film is deposited on the protective film 31 as a protective film 32 (a protective film which contains oxide or oxynitride). The reflectance on the light emitting facet of the cavity can be controlled by adjusting the thicknesses of the protective films 31 and 32. In this embodiment, the laser light reflectance is 18%.

In this embodiment, the protective film 31 and the protective film 32 are sequentially formed on the light emitting facet of the cavity. Nevertheless, even if only the protective film 31 serves as the protective film formed on the light emitting facet, the above-described effects are attainable so long as the thickness thereof is set so that the reflectance is 18%. Likewise, it does not matter whether the protective film 32 is a niobium oxide ($Nb_2O_5$) film, a $ZrO_2$ film, a $SiO_2$ film, etc.

instead of an aluminum oxynitride film so long as the thickness thereof is set so that the reflectance is 18%. Alternatively, the protective film 32 may be a film made of an oxide or an oxynitride of Ti, Ta, Ga, or Hf.

Third Embodiment

Figure 6:
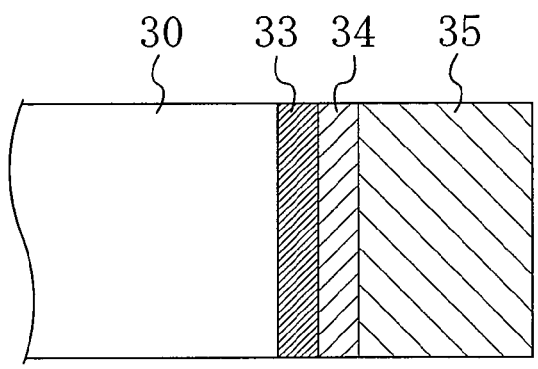
FIG. 6 is a cross-sectional view of the nitride semiconductor light emitting device according to the third embodiment of the invention, taken in a direction parallel to the longitudinal direction of the cavity.

A third embodiment of the present invention will be described below with reference to FIG. 6.

This embodiment differs from the first embodiment only in the method for forming the protective film on the light emitting facet of the cavity after the primary cleavage. This embodiment will be described mainly in terms of its differences from the first embodiment.

A method for forming a protective film on the light-emitting facet of the cavity will be described. Before the formation of the protective film, a cleaning process is performed on the light emitting facet of the cavity. Thereafter, a gas containing Ar and a gas containing $N_2$ are introduced into the film formation chamber 105 to generate plasma while a bias is applied to the target 110, thereby depositing an aluminum nitride (AlN) film on the facet 30 of the cavity as a protective film 33. In this embodiment, since an aluminum nitride film is formed as the protective film 33, the target 110 is Al, and the protective film 33 is formed in the chamber in which the Al target is placed.

The protective film 33 may also be an aluminum oxynitride (AlON) film. If the protective film 33 is an AlON film, stress is reduced as compared to cases in which a nitride film is used as the protective film 33, thereby enabling the formation of the protective film 33 having a greater thickness. This is preferable because design freedom is increased.

Subsequently, an aluminum nitride (AlN) film is deposited in a similar manner on the protective film 33 as a second protective film 34. As shown in FIG. 4, in forming the second protective film 34, if the second protective film 34 is deposited on the protective film 33 by using a plasma in which the $N_2$ partial pressure is high, a lower deposition rate is achieved.

Reductions in the deposition rate prevent the second protective film 34 from being influenced by the state of the crystal axes of the crystal plane constituting the light emitting facet of the cavity. Hence, the growth mode in the directions of crystal axes along which the aluminum nitride film can easily grow becomes dominant, thereby making it possible to obtain the crystal film (the second protective film 34) oriented in the direction of the C-axis (0001) that differs by 90 degrees from the crystal axes of the crystal plane constituting the light emitting facet of the cavity. As a result, the bond length between atoms constituting the second protective film 34 is shortened, thus enabling the second protective film 34 to be formed denser.

Since the second protective film 34 is made of aluminum nitride crystals oriented in the C-axis, and thus is dense, permeation of oxygen through the second protective film 34 during reliability testing is suppressed. Furthermore, the dense second protective film 34 allows suppression of permeation of oxygen in the location further away from the light emitting facet of the cavity, so that variations, among devices, in COD level reduction during reliability evaluation are reduced, thereby attaining stable reliability.

Lastly, an aluminum oxide ($Al_2O_3$) film is deposited on the second protective film 34 as a protective film (a protective film which contains oxide or oxynitride) 35. The reflectance on the light emitting facet of the cavity can be controlled by adjusting the thicknesses of the protective film 33, second protective film 34, and protective film 35. In this embodiment, the thicknesses of these protective films are adjusted so that the laser light reflectance is 18%.

In this embodiment, the protective film 33, the second protective film 34, and the protective film 35 are formed as the protective films on the light emitting facet of the cavity. Nevertheless, even if only the protective film 33 and the second protective film 34 are the protective films formed on the light emitting facet of the cavity, the above-described effects are attainable so long as the thicknesses thereof are set so that the reflectance is 18%. Likewise, it does not matter whether the protective film 35 is an aluminum oxynitride (AlON) film, a niobium oxide ($Nb_2O_5$) film, a $ZrO_2$ film, a $SiO_2$ film, etc. instead of an aluminum oxide film so long as the thickness thereof is set so that the reflectance is 18%. Alternatively, the protective film 35 may be a film made of an oxide or an oxynitride of Ti, Ta, Ga, or Hf. Moreover, the second protective film 34 is not limited to the film made of aluminum nitride crystals, but may be a film made of nitride crystals or oxynitride crystals.

Fourth Embodiment

A fourth embodiment of the present invention will be described below with reference to FIG. 3.

This embodiment differs from the first embodiment only in the process step for forming the protective film on the light emitting facet of the cavity after the primary cleavage.

First, a method for forming a protective film on the light-emitting facet of the cavity will be described. Before the formation of the protective film on the light emitting facet of the cavity, a cleaning process is performed. Thereafter, a gas containing Ar and a gas containing $N_2$ are introduced into the film formation chamber 105 to generate a plasma while a bias is applied to the target 110, thereby depositing an aluminum nitride (AlN) film on the facet 30 of the cavity as a protective film 31. In this embodiment, since aluminum nitride is formed as the protective film 31, the target 110 is Al, and the protective film 31 is formed on the light emitting facet of the cavity in the chamber in which the Al target is placed.

In this embodiment, the deposition rate of the protective film 31 is higher than those in the first to third embodiments. When formed at a high deposition rate in this way, the protective film 31 is allowed to be made of aluminum nitride crystals having mixed crystal axes. Also, the orientation of the aluminum nitride crystals can be controlled by changing the $N_2$ partial pressure during the deposition of the protective film 31. For example, in the vicinity of the cavity facet, a film made of aluminum nitride crystals having mixed crystal axes may be formed at a high deposition rate. In the location away from the cavity facet, a dense crystal film, in which aluminum nitride crystals are oriented in the direction of the C-axis (0001) that differs by 90 degrees from the crystal axes of the crystal plane constituting the cavity facet, may be formed at a low deposition rate. Hence, permeation of oxygen through the protective film is suppressed in the location away from the cavity facet, so that variations, among devices, in COD level reduction during reliability evaluation are reduced, thereby attaining stable reliability.

In this case, the nitrogen partial pressure in the mixture of the Ar-containing gas and $N_2$-containing gas is set as follows. When the nitrogen partial pressure is set to be from about 5% to about 15%, it is possible to form the protective film 31 having mixed crystal axes; when the nitrogen partial pressure is set at 20% or higher, it is possible to obtain the protective film 31 whose crystal axes differ by 90 degrees from those of the cavity facet.

After the formation of the protective film 31 made of aluminum nitride crystals on the light emitting facet of the cavity, an aluminum oxide ($Al_2O_3$) film is deposited on the protective film 31 as a protective film 32 (a protective film which contains oxide or oxynitride). The reflectance on the light emitting facet of the cavity is controlled by adjusting the thicknesses of the protective films 31 and 32. In this embodiment, the thicknesses of the protective films 31 and 32 are adjusted so that the laser light reflectance is 18%.

In this embodiment, the protective films 31 and 32 are formed on the light emitting facet of the cavity. However, only the protective film 31 may be formed on the light emitting facet of the cavity so long as the thickness thereof is set so that the reflectance on the light emitting facet is 18%. Likewise, it does not matter whether the protective film 32 is an aluminum oxynitride (AlON) film, a niobium oxide ($Nb_2O_5$) film, a $ZrO_2$ film, a $SiO_2$ film, etc. instead of an aluminum oxide film, so long as the thickness thereof is set so that the reflectance on the light emitting facet of the cavity is 18%. Alternatively, the protective film 32 may be a film made of an oxide or an oxynitride of Ti, Ta, Ga, or Hf.

The following can be said for the first to fourth embodiments.

In order to lower the voltage for operating the nitride semiconductor light emitting device, the p-side Pd/Pt contact electrode 19 is preferably made of material that can reduce the contact resistance with the p-type GaN contact layer 17 and that can achieve good adhesion to the p-type GaN contact layer 17. In this embodiment, the p-side Pd/Pt contact electrode 19 serves as a p-side contact electrode. However, even if a p-side contact electrode made of Ni/Au, Ni/Pt/Au, Pd, Pd/Mo, Pd/Au, etc. is employed, the contact resistance with the p-type GaN contact layer 17 will be reduced, and good adhesion to the p-type GaN contact layer 17 will be achieved.

Moreover, in the examples described in the first to fourth embodiments, the n-type GaN substrate is used as the substrate, however, even when substrates made of other materials are used, the same effects are also attainable; such other substrates include a sapphire substrate, a low dislocation substrate obtained by performing ELOG (Epitaxial Lateral Over Growth) or ABLEG (Air Bridge Lateral Epitaxial Growth) on a sapphire substrate, a low dislocation substrate obtained by performing ELOG on a GaN substrate, a GaN template substrate from which sapphire has been removed by laser liftoff, an SiC substrate, an Si substrate, a GaAs substrate, an InP substrate, a substrate made of NGO ($NbGaO_3$), and a substrate made of LGO ($LiGaO_3$), for example.

In the first to fourth embodiments, the example light emitting devices made of nitride semiconductors have been described. Nevertheless, the present invention is applicable to light emitting devices made of other materials, for example, AlGaInP-, AlGaAs- and InGaAsP-based semiconductor light emitting devices.

What is claimed is:

1. A nitride semiconductor light emitting device comprising a nitride semiconductor multilayer film formed on a substrate,
wherein the nitride semiconductor multilayer film includes a light emitting layer and facets of a cavity, and is made of nitride semiconductor crystals;
a protective film made of aluminum nitride crystals is formed on at least one of the facets of the cavity; and
the protective film has a crystal plane whose crystal axes form an angle of 90 degrees with crystal axes of a crystal plane of the nitride semiconductor crystals constituting the facet of the cavity having the protective film formed thereon.

2. A nitride semiconductor light emitting device comprising a nitride semiconductor multilayer film formed on a substrate,
wherein the nitride semiconductor multilayer film includes a light emitting layer and facets of a cavity, and is made of nitride semiconductor crystals;
a protective film made of nitride crystals or oxynitride crystals is formed on at least one of the facets of the cavity;
a second protective film made of aluminum nitride crystals is formed on the protective film; and
the second protective film has a crystal plane whose crystal axes form an angle of 90 degrees with crystal axes of a crystal plane of the nitride semiconductor crystals constituting the facet of the cavity having the second protective film formed thereover.

3. The nitride semiconductor light emitting device of claim 2, wherein the protective film is made of aluminum nitride crystals.

4. The nitride semiconductor light emitting device of claim 1, wherein the protective film further has a crystal plane whose crystal axes are in parallel with the crystal axes of the crystal plane of the nitride semiconductor crystals constituting the facet of the cavity having the protective film formed thereon.

5. The nitride semiconductor light emitting device of claim 1, wherein the amount of silicon at an interface between the protective film and the facet of the cavity having the protective film formed thereon is $1 \times 10^{20}$ atoms/cm³ or less.

6. The nitride semiconductor light emitting device of claim 5, wherein when the amount of silicon per unit area at the interface is calculated by secondary ion mass spectrometry, the amount of silicon at the interface is $2 \times 10^{14}$ atoms/cm² or less.

7. The nitride semiconductor light emitting device of claim 1, wherein a protective film containing oxide or oxynitride is formed on the protective film.

8. The nitride semiconductor light emitting device of claim 2, further comprising, on the second protective film, a protective film containing oxide or oxynitride.

9. The nitride semiconductor light emitting device of claim 7, wherein the protective film containing oxide or oxynitride contains at least one element selected from the group consisting of Al, Si, Zr, Ti, Ta, Ga, Nb, and Hf.

* * * * *